United States Patent
Sharma et al.

(10) Patent No.: US 6,750,491 B2
(45) Date of Patent: *Jun. 15, 2004

(54) MAGNETIC MEMORY DEVICE HAVING SOFT REFERENCE LAYER

(75) Inventors: Manish Sharma, Sunnyvale, CA (US); Thomas C. Anthony, Sunnyvale, CA (US); Lung Tran, Saratoga, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 173 days.

This patent is subject to a terminal disclaimer.

(21) Appl. No.: 10/029,694

(22) Filed: Dec. 20, 2001

(65) Prior Publication Data

US 2003/0117840 A1 Jun. 26, 2003

(51) Int. Cl.[7] .................................................. H01L 29/76
(52) U.S. Cl. ........................ 257/295; 257/421; 257/422; 257/428; 365/171; 365/173; 365/151; 365/158
(58) Field of Search ................................. 257/421, 422, 257/428; 365/171, 173, 151, 158

(56) References Cited

U.S. PATENT DOCUMENTS 6,621,732 B2 * 9/2003 Allenspach et al. ......... 365/173

* cited by examiner

*Primary Examiner*—David Nelms
*Assistant Examiner*—Mai-Huong Tran

(57) ABSTRACT

A magnetic memory device includes first and second ferromagnetic layers. Each ferromagnetic layer has a magnetization that can be oriented in either of two directions. The first ferromagnetic layer has a higher coercivity than the second ferromagnetic layer. The magnetic memory device further includes a structure for forming a closed flux path with the second ferromagnetic layer.

13 Claims, 11 Drawing Sheets

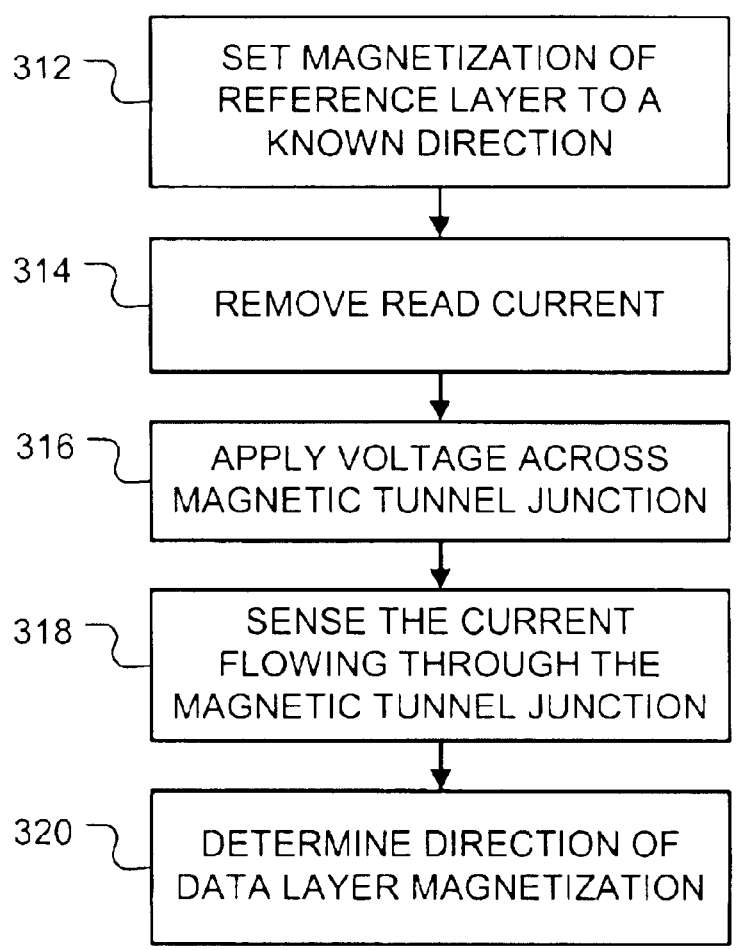

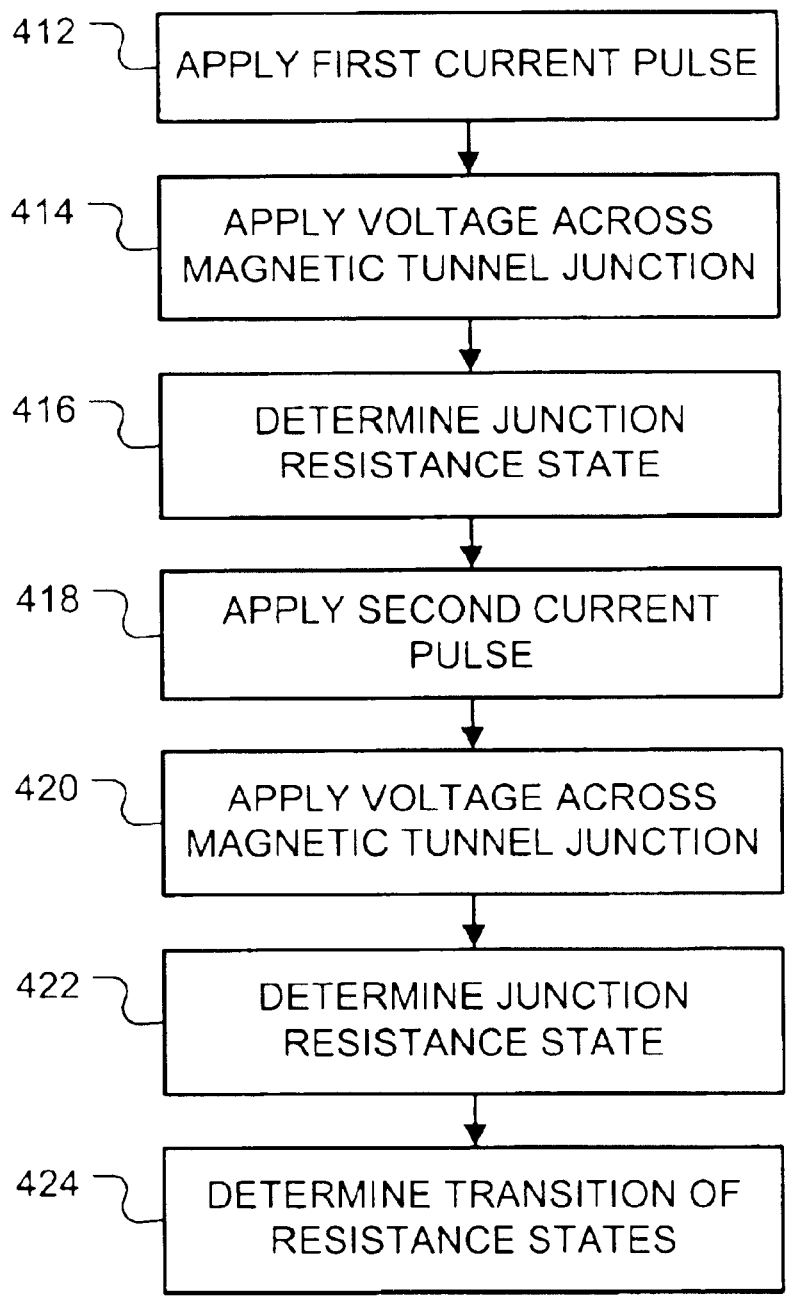

FIG. 5b
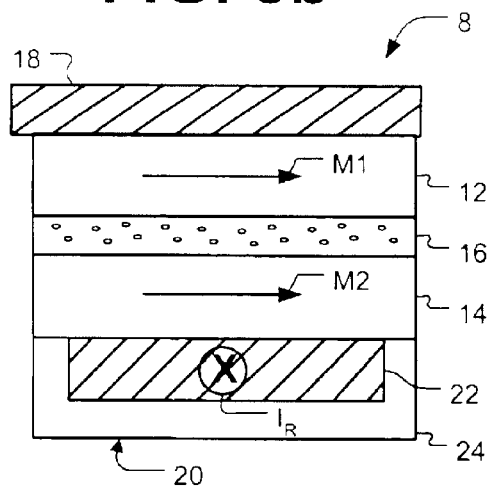
FIG. 5c
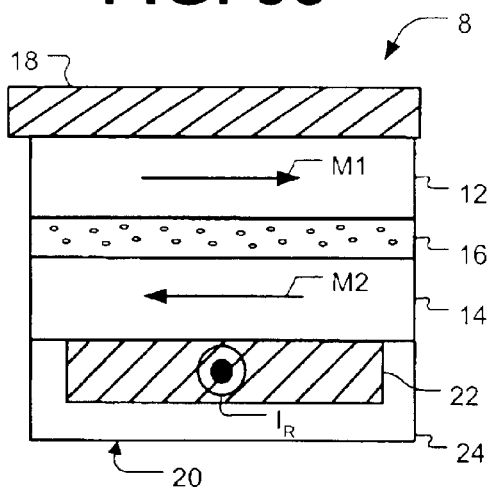
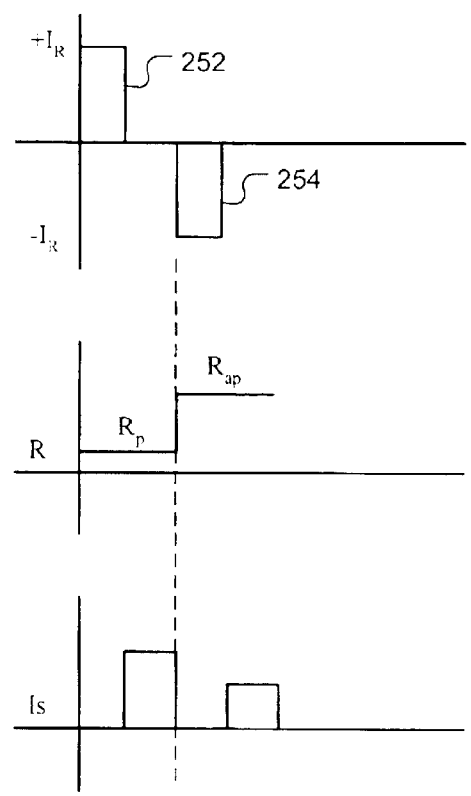
FIG. 5a
FIG. 5d
FIG. 5e

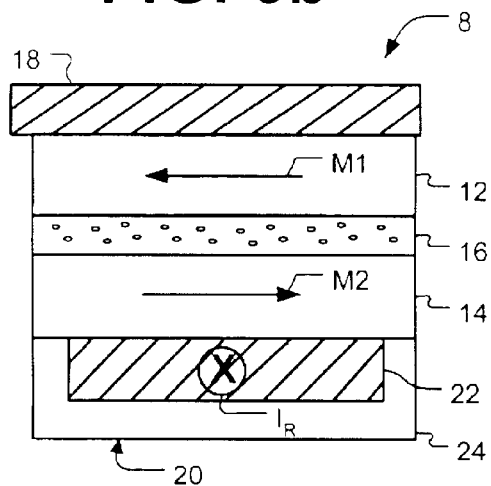
FIG. 6b
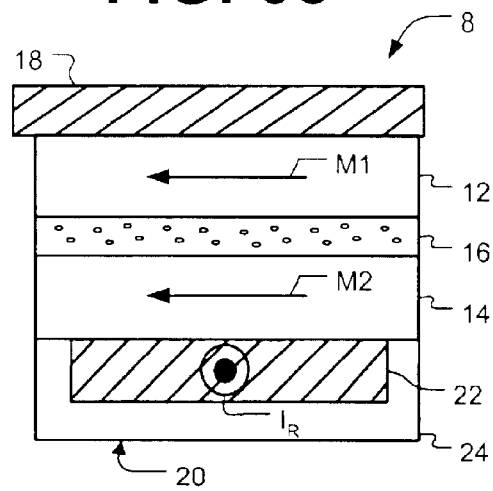
FIG. 6c
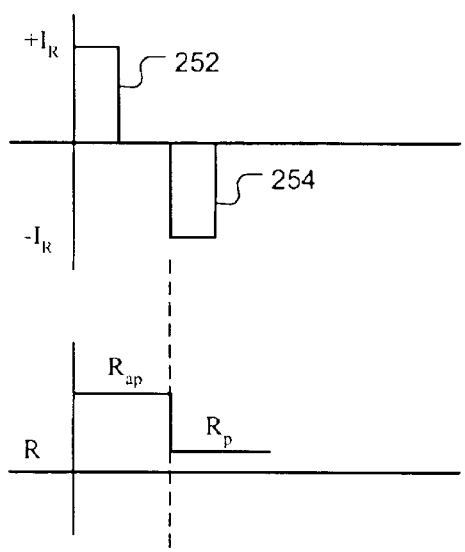
FIG. 6a
FIG. 6d
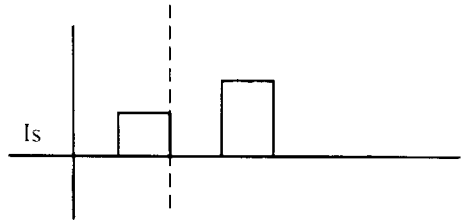
FIG. 6e

MAGNETIC MEMORY DEVICE HAVING SOFT REFERENCE LAYER

BACKGROUND

Magnetic Random Access Memory ("MRAM") is a non-volatile memory that is being considered for short-term and long-term data storage. MRAM has lower power consumption than short-term memory such as DRAM, SRAM and Flash memory. MRAM can perform read and write operations much faster (by orders of magnitude) than conventional long-term storage devices such as hard drives. In addition, MRAM is more compact and consumes less power than hard drives. MRAM is also being considered for embedded applications such as extremely fast processors and network appliances.

A typical MRAM device includes an array of memory cells, word lines extending along rows of the memory cells, and bit lines extending along columns of the memory cells. Each memory cell is located at a cross point of a word line and a bit line.

The memory cells may be based on tunneling magneto-resistive (TMR) devices such as spin dependent tunneling (SDT) junctions. A typical SDT junction includes a pinned layer, a sense layer and an insulating tunnel barrier sandwiched between the pinned and sense layers. The pinned layer has a magnetization orientation that is fixed so as not to rotate in the presence of an applied magnetic field in a range of interest. The sense layer has a magnetization that can be oriented in either of two directions: the same direction as the pinned layer magnetization or the opposite direction of the pinned layer magnetization. If the magnetizations of the pinned and sense layers are in the same direction, the orientation of the SDT junction is said to be "parallel." If the magnetizations of the pinned and sense layers are in opposite directions, the orientation of the SDT junction is said to be "anti-parallel." These two stable orientations, parallel and anti-parallel, may correspond to logic values of '0' and '1.'

The magnetization orientation of the pinned layer may be fixed by an underlying antiferromagnetic (AF) pinning layer. The AF pinning layer provides a large exchange field, which holds the magnetization of the pinned layer in one direction. Underlying the AF layer are usually first and second seed layers. The first seed layer allows the second seed layer to be grown with a (111) crystal structure orientation. The second seed layer establishes a (111) crystal structure orientation for the AF pinning layer.

SUMMARY

According to one aspect of the present invention, a magnetic memory device includes first and second ferromagnetic layers. Each ferromagnetic layer has a magnetization that can be oriented in either of two directions. The first ferromagnetic layer has a higher coercivity than the second ferromagnetic layer. The magnetic memory device further includes a structure for forming a closed flux path with the second ferromagnetic layer.

Other aspects and advantages of the present invention will become apparent from the following detailed description, taken in conjunction with the accompanying drawings, illustrating by way of example the principles of the present invention.

BRIEF DESCRIPTION OF THE DRAWINGS

FIG. 3 is an illustration of a first method of reading the magnetic memory device.

FIG. 4 is an illustration of a second method of reading the magnetic memory device.

FIGS. 5a–5e and 6a–6e further illustrate the second method.

FIGS. 7b and 7c are timing diagrams for the circuit shown in FIG. 7a.

FIGS. 8b and 8c are timing diagrams for the circuit shown in FIG. 8a.

DETAILED DESCRIPTION

Figure 1:
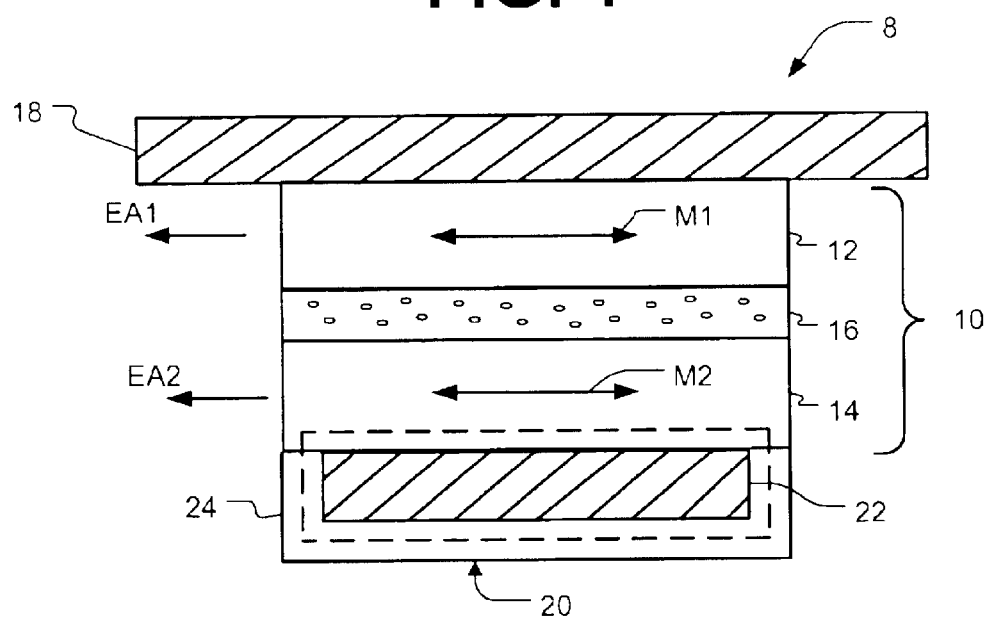
FIG. 1 is an illustration of a magnetic memory device according to a first embodiment of the present invention.

Reference is made to FIG. 1, which illustrates a magnetic memory device 8. A magnetic tunnel junction 10 includes a data layer 12, a reference layer 14, and an insulating tunnel barrier 16 between the data and reference layers 12 and 14. Both the data and reference layers 12 and 14 are made of a ferromagnetic material. The data layer 12 has a magnetization (represented by the vector M1) that can be oriented in either of two directions, typically along the easy axis (EA1) of the data layer 12. The reference layer 14 has a magnetization (represented by the vector M2) that can be oriented in either of two directions, typically along its easy axis (EA2). The easy axes (EA1, EA2) are shown as extending in the same direction.

If the magnetization vectors (M1 and M2) of the data and reference layers 12 and 14 are pointing in the same direction, the orientation of the magnetic tunnel junction 10 is said to be "parallel" (see FIGS. 5b and 6c). If the magnetization vectors (M1 and M2) of the data and reference layers 12 and 14 are pointing in opposite directions, the orientation of the magnetic tunnel junction 10 is said to be "anti-parallel" (see FIGS. 5c and 6b). These two stable orientations, parallel and anti-parallel, may correspond to logic values of '0' and '1.'

The insulating tunnel barrier 16 allows quantum mechanical tunneling to occur between the data and reference layers 12 and 14. This tunneling phenomenon is electron spin dependent, causing the resistance of the magnetic tunnel junction 10 to be a function of the relative orientations of the magnetization vectors (M1 and M2) of the data and reference layers 12 and 14. For instance, resistance of the magnetic tunnel junction 10 is a first value (R) if the magnetization orientation of the magnetic tunnel junction 10 is parallel and a second value (R+ΔR) if the magnetization orientation is anti-parallel. The insulating tunnel barrier 16 may be made of aluminum oxide (Al$_2$O$_3$), silicon dioxide (SiO$_2$), tantalum oxide (Ta$_2$O$_5$), silicon nitride (SiN$_4$), aluminum nitride (AlNx), or magnesium oxide (MgO). Other dielectrics and certain semiconductor materials may be used for the insulating tunnel barrier 16. Thickness of the insulating tunnel barrier 16 may range from about 0.5 nanometers to about three nanometers.

Figure 2:
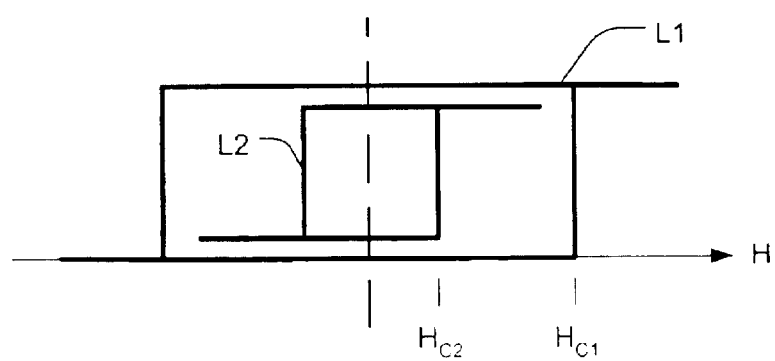
FIG. 2 is an illustration of hysteresis loops for data and reference layers of the magnetic memory device.

Additional reference is now made to FIG. 2, which shows hysteresis loops L1 and L2 for the data and reference layers 12 and 14, respectively. Coercivity ($H_{C1}$) of the data layer 12 is much greater than coercivity ($H_{C2}$) of the reference layer 14. The coercivity ($H_{C1}$) of the data layer 12 may be at least 2–5 times greater than the coercivity ($H_{C2}$) of the reference layer 14. For example, the coercivity ($H_{C1}$) of the data layer 12 may be about 25 Oe, and the coercivity ($H_{C2}$) of the reference layer 14 may be about 5 Oe. It is preferred to make the coercivity ($H_{C2}$) of the reference layer 14 as low as possible (e.g., by making the reference layer 14 as thin as possible). Thus, the reference layer 14 is considered "softer" than the data layer 12 because its magnetization vector (M2) is much easier to flip.

Coercivities of the data and reference layers 12 and 14 may be made different by using different bit shapes, geometries, compositions, thickness, etc. for the two layers 12 and 14. Potential ferromagnetic layer materials include nickel iron (NiFe), nickel iron cobalt (NiFeCo), cobalt iron (CoFe), other magnetically soft alloys of NiFe and Co, doped amorphous ferromagnetic alloys, and PERMALLOY™ alloy. For example, the data layer 12 may be made of a material such as NiFeCo or CoFe, and the reference layer 14 may be made of a material such as NiFe.

Referring once again to FIG. 1, a first electrical conductor 18 is in contact with the data layer 12. The first conductor 18 may be made of a material such as copper, aluminum or metal alloy.

The direction of the reference layer magnetization vector (M2) is set by a structure 20 including a second electrical conductor 22 that is partially clad with a ferromagnetic material such as NiFe. The second conductor 22, made of an electrically conductive, magnetically non-conductive material such as copper, aluminum or metal alloy, may extend in a direction that is orthogonal to the direction of the first conductor 18.

The ferromagnetic cladding 24 completely covers three sides of the second conductor 22. The depiction of the cladding thickness is exaggerated: the thickness may be about 1 nm to 50 nm (with a typical value of 5 nm). The unclad side of the second conductor 22 is in direct contact with the reference layer 14.

Portions of the cladding 24 are in direct contact with the reference layer 14, thus placing the reference layer 14 in magnetic communication with the cladding 24. As a result, the reference layer 14 and the cladding 22 form a closed flux path (indicated by dashed lines).

Reference is now made to FIGS. 5a and 5b. When a current ($I_R$) is supplied to the second conductor 22, a magnetic field is generated about the second conductor 22. If the current flows into the second conductor 22 (as indicated by the "X"), the magnetic field causes the reference layer magnetization vector (M2) to point to the right (FIG. 5b). If the current flows in the opposite direction (as indicated by the "●"), the magnetic field causes the reference layer magnetization vector (M2) to point to the left (FIG. 5c).

After the current ($I_R$) is removed, the reference layer magnetization vector (M2) retains its orientation. The orientation is retained because of the closed flux path formed by the reference layer 14 and the cladding 24.

Consider a magnetic tunnel junction 10 having a nominal resistance (R) of 1 Mohm, and a tunneling magneto-resistance of 30%. If the data layer magnetization vector (M1) is pointing to the left, and the magnetic field causes the reference layer magnetization vector (M2) to point to the right (FIG. 6b), the magnetization orientation of the magnetic tunnel junction 10 will be anti-parallel, and the resistance of the magnetic tunnel junction 10 will be R+ΔR or 1.3 Mohms. If the data layer magnetization vector (M1) is pointing to the left, and the magnetic field causes the reference layer magnetization vector (M2) to point to the left (FIG. 6c), the magnetization orientation of the magnetic tunnel junction 10 will be parallel, and the resistance of the magnetic tunnel junction 10 will be R=1.0 Mohms.

Data may be written to the magnetic tunnel junction 10 by setting the direction of the data layer magnetization vector (M1). During a write operation, write currents are supplied to the first and second conductors 18 and 22. The current supplied to the first conductor 18 creates a magnetic field about the first conductor 18, and the current supplied to the second conductor 22 creates a magnetic field about the second conductor 22. The two magnetic fields, when combined, exceed the coercivity ($H_{C1}$) of the data layer 12 and, therefore, cause the magnetization vector (M1) of the data layer 12 to be set in a desired orientation (the orientation depends upon the directions of the currents supplied to the first and second conductors 18 and 22). The data layer magnetization vector (M1) will be set to either the orientation that corresponds to a logic '1' or the orientation that corresponds to a logic '0'. Because the coercivity ($H_{C2}$) of the reference layer 14 is less than that of the data layer 12, the combined magnetic fields cause magnetization (M2) of the reference layer 14 to assume that same orientation as the magnetization (M1) as the data layer 12.

Data is read from the magnetic tunnel junction 10 by sensing the resistance state (either R or R+ΔR) of the magnetic tunnel junction 10. FIG. 3 illustrates a first method of reading the magnetic tunnel junction 10. A read current is supplied to the second conductor 22 to set the reference layer magnetization in a known direction (block 312). The resulting magnetic field does not affect the magnetization of the data layer 12. Since the coercivity ($H_{C2}$) of the reference layer 14 is low, the magnitude of the read current may be low.

The read current is removed (block 314), but the reference layer 14 retains its magnetization orientation. A voltage is applied across the first and second conductors 18 and 22, and hence across the magnetic tunnel junction 10 (block 316). The voltage causes a sense current to flow through the magnetic tunnel junction 10.

The resistance of the magnetic tunnel junction 10 is measured by sensing the current flowing though the magnetic tunnel junction 10 (block 318). The sensed current is inversely proportional to the resistance of the magnetic tunnel junction 10. Thus $I_s = V/R$ or $I_s = V/(R+\Delta R)$, where V is the applied voltage, $I_s$ is the sensed current, R is the nominal resistance of the device 10, and ΔR is the change in resistance caused by going from a parallel magnetization orientation to an anti-parallel magnetization orientation.

Now that the direction of the reference layer magnetization vector (M2) and the magnetization orientation of the magnetic tunnel junction 10 are known, the direction of the data layer magnetization can be determined (block 320). The direction of the data layer magnetization indicates whether a logic '1' or a logic '0' is stored in the magnetic tunnel junction 10.

FIG. 4 illustrates a second method of reading the magnetic tunnel junction. A first current pulse is applied to the second conductor 22 (block 412). The first current pulse sets the reference layer magnetization in a first direction. A voltage is applied across the magnetic tunnel junction 10 (block 414), and the resistance state of the magnetic tunnel junction 10 is measured by sensing the current flowing through the magnetic tunnel junction (416). A second current pulse is applied to the second conductor 22 (block 418). Polarity of the second current pulse is opposite that of the first current pulse; therefore, the second current pulse sets the reference layer magnetization in a second (opposite) direction. A voltage is applied across the magnetic tunnel junction 10 (block 420), and the resistance state of the magnetic tunnel junction 10 is measured for a second time (block 422). These two measurements (blocks 416 and 422) yield a sequence of resistance states: either <$R_p$, $R_{ap}$> or <$R_{ap}$, $R_p$>, where $R_{ap}$ is the resistance state when the magnetization orientation of the magnetic tunnel junction 10 is anti-parallel, and $R_p$ is the resistance state when the magnetization orientation of the magnetic tunnel junction 10 is parallel.

The direction of the resistance state transition (that is, going from $R_p$ to $R_{ap}$, or $R_{ap}$ to $R_p$) is determined (block 424). The direction of transition indicates the magnetization orientation of the data layer 12 and, therefore, the logic value stored in the magnetic memory device 10.

FIGS. 5a–5e further illustrate the second method in connection with a data layer 12 that stores a logic '0.' The first and second pulses 252 and 254 are applied to the second conductor 22 (FIG. 5a). The first pulse 252 is temporally spaced apart from the second pulse 254. The first pulse 252 has a positive polarity (corresponding to a logic '0'), which orients the reference layer magnetization vector (M2) of the in the same direction as that of the data layer 12 (FIG. 5b), whereby the magnetization orientation of the magnet tunnel junction 10 is parallel and its resistance state is $R_p$. The second pulse 254 has a negative polarity (corresponding to a logic '1'), which orients the reference layer magnetization vector (M2) in the opposite direction (FIG. 5c), whereby the magnetization orientation of the magnetic tunnel junction 10 is anti-parallel and its resistance state is $R_{ap}$. Thus the resistance of the device 10 transitions from $R_p$ to $R_{ap}$ (FIG. 5d). The $R_p$-to-$R_{ap}$ transition indicates that a logic '0' is stored in the memory device 10. The corresponding sense current pulses are shown in FIG. 5e.

FIGS. 6a–6e illustrate the second method in connection with a data layer 12 that stores a logic '1.' The same positive and negative current pulses 252 and 254 are applied to the second conductor 22 (FIG. 6a). The magnetic tunnel junction transitions from an anti-parallel magnetization orientation (FIG. 6b) to a parallel magnetization orientation (FIG. 6c), whereby the resistance of the magnetic memory device 10 transitions from $R_{ap}$ to $R_p$ (FIG. 6d). Thus the $R_{ap}$-to-$R_p$ transition indicates that a logic '1' is stored in the magnetic tunnel junction 10. The corresponding sense current pulses are shown in FIG. 6e.

This second read method is self-referencing. Therefore, this dynamic approach is insensitive to resistance variations across different devices.

The second method is not limited to a positive polarity that corresponds to a logic '0' and a negative polarity that corresponds to a logic '1'. For example, a positive polarity could just as easily correspond to a logic '1', the first and second pulses could have negative and positive polarities, respectively, etc.

Figure 7A:
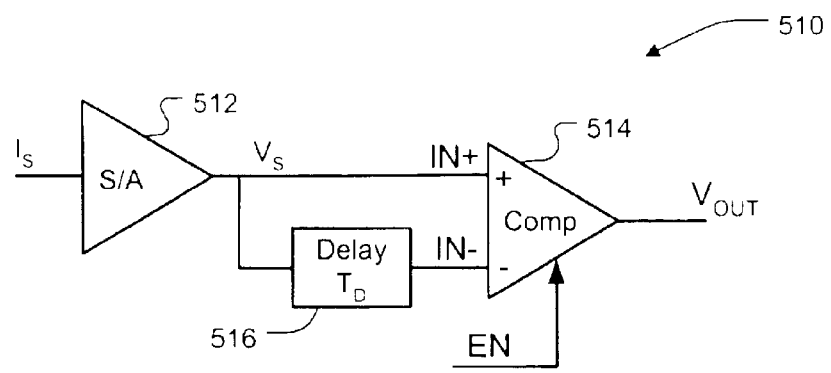
FIG. 7a is an illustration of a circuit for implementing the second method.
Figure 7B:
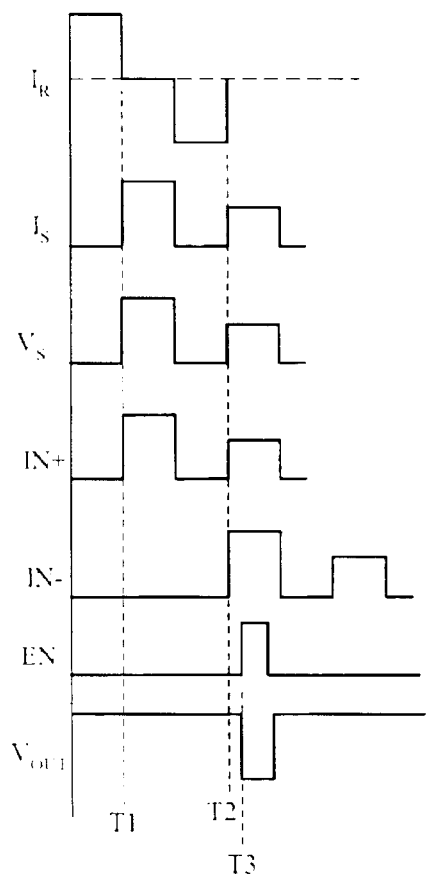
Figure 7C:
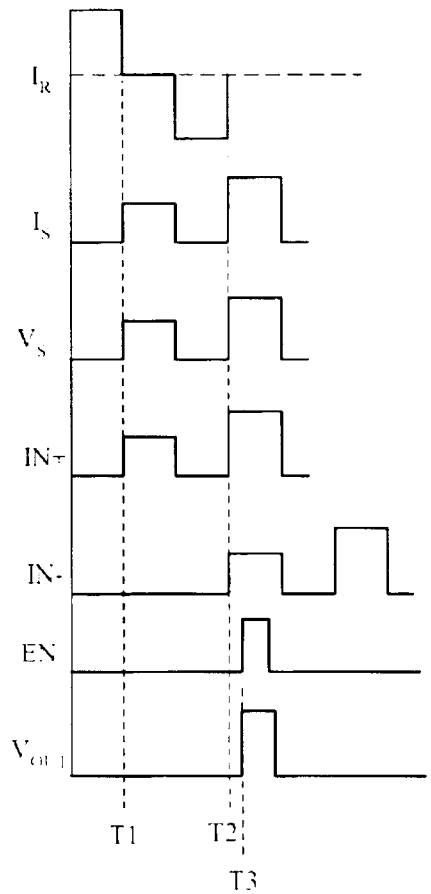

A simple sense amplifier 510 for detecting the resistance transition is shown in FIG. 7a, and timing diagrams are shown in FIGS. 7b and 7c (FIG. 7b corresponds to FIGS. 5a–5e, and FIG. 7c corresponds to FIGS. 6a–6e). The sense current ($I_S$) flowing through the magnetic tunnel junction 10 is supplied to an amplifier 512. Sense current pulses occurs at times T1 and T2. An output of the amplifier 512 provides a voltage ($V_S$) that is proportional to sense current magnitude. The amplifier output is supplied to a first input (IN+) of a comparator 514 and a delay element 516, which has a delay ($T_D$) of $T_D$=T1−T2 seconds. An output of the delay element 516 is supplied to a second input (IN−) of the comparator 514. The comparator 514 compares the sense voltage ($V_S$) at the first comparator input (IN+) to the delayed sense voltage at the second comparator input (IN−). An enable pulse (EN) occurs at time T3 to enable the comparison of the voltages at the comparator inputs (IN+ and IN−). An output (VOUT) of the comparator 514 indicates the logic state stored in the magnetic tunnel junction 10.

Figure 8A:
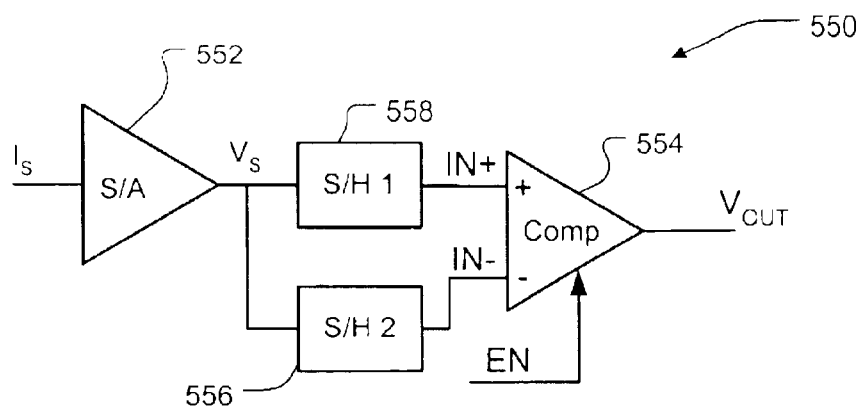
FIG. 8a is an illustration of another circuit for implementing the second method.
Figure 8B:
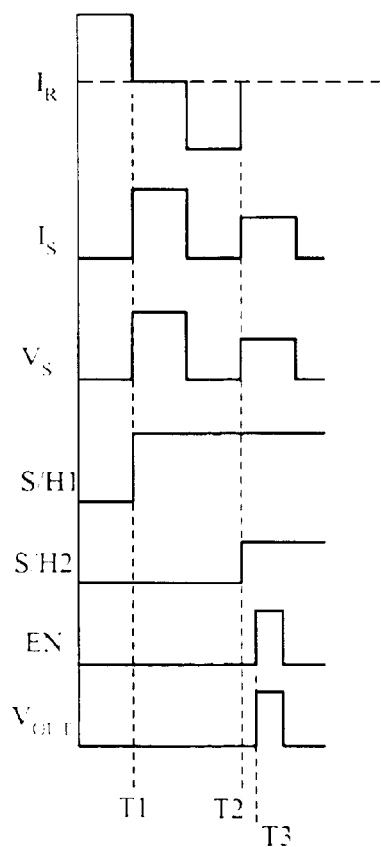
Figure 8C:
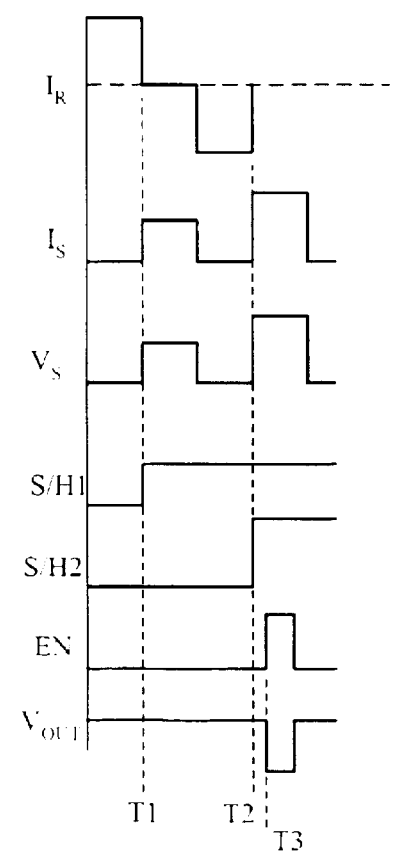

Another simple sense amplifier 550 for detecting the resistance transition is shown in FIG. 8a, and timing diagrams are shown in FIGS. 8b and 8c (FIG. 8b corresponds to FIGS. 5a–5e, and FIG. 8c corresponds to FIGS. 6a–6e). The sense current ($I_S$) flowing through the magnetic tunnel junction 10 is supplied to an amplifier 552. Sense current pulses occur at times T1 and T2. The amplifier 552 generates a voltage ($V_S$) that is proportional to sense current magnitude. An output of the amplifier 552 is supplied to first and second sample/holds 556 and 558. The first sample/hold 556 samples the amplifier output (the first current pulse) at time T1, and the second sample/hold 556 samples the sense amplifier output (the second current pulse) at time T2. An enable pulse (EN) is supplied to a comparator 554 at time T3 to enable the comparison of the contents of the sample/holds 556 and 558. An output ($V_{OUT}$) of the comparator 554 indicates the logic state stored in the magnetic tunnel junction 10.

Figure 9:
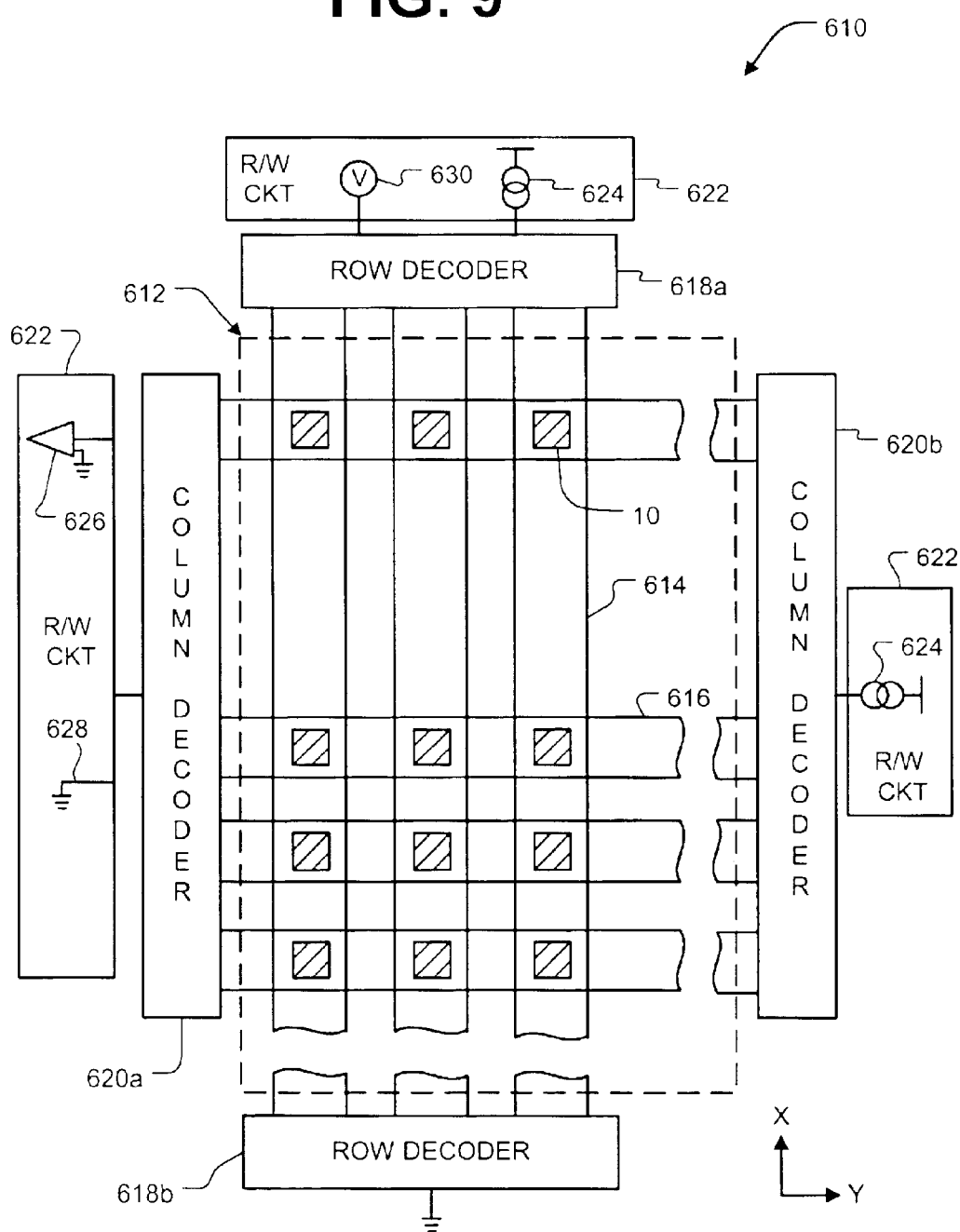
FIG. 9 is an illustration of an MRAM device according to an embodiment of the present invention.

Reference is now made to FIG. 9, which illustrates an MRAM device 610 including an array 612 of magnetic tunnel junctions 10. The magnetic tunnel junctions 10 are arranged in rows and columns, with the rows extending along an x-direction and the columns extending along a y-direction. Only a relatively small number of the magnetic tunnel junctions 10 is shown to simplify the illustration of the MRAM device 610. In practice, arrays of any size may be used.

Traces functioning as word lines 614 extend along the x-direction in a plane on one side of the array 612. The word lines 614 are in contact with the data layers of the magnetic tunnel junctions 10. Traces functioning as bit lines 616 extend along the y-direction in a plane on an adjacent side of the array 612. The bit lines 616 are partially clad with ferromagnetic material. There may be one word line 614 for each row of the array 612 and one bit line 616 for each column of the array 612. Each magnetic memory tunnel junction 10 is located at a cross point of a word line 614 and a bit line 616.

Each bit line 616 is fully clad on three sides. An unclad side of each bit line is in contact with a column of reference layers. As a result, each clad bit line 616 closes the magnetic flux path for a column of reference layers.

The MRAM device 610 also includes first and second row decoders 618a and 618b, first and second column decoders 620a and 620b, and a read/write circuit 622. The decoders 618a, 618b, 620a and 620b select word and bit lines 614 and 616 during read and write operations. A selected magnetic tunnel junction 10 lies at the cross point of a selected word and bit line 614 and 616.

The read/write circuit 622 includes current sources 624 for applying write currents to selected word and bit lines 614 and 616 during write operations. The read/write circuit 622 includes a sense amplifier 626, ground connections 628, and a voltage source 630 for applying voltages during read operations.

The magnetic tunnel junctions 10 are coupled together through many parallel paths. The resistance seen at one cross point equals the resistance of the magnetic tunnel junction 10 at that cross point in parallel with resistances of magnetic tunnel junctions 10 in the other rows and columns. Thus the array 612 of magnetic tunnel junctions 10 may be characterized as a cross point resistor network.

Because the magnetic tunnel junctions 10 are connected as a cross point resistor network, parasitic or sneak path currents can interfere with the read operations on selected magnetic tunnel junctions 10. Blocking devices such as diodes or transistors may be connected to the magnetic tunnel junctions 10. These blocking devices can block the parasitic currents.

The read/write circuit 622 may use either read method described above. If blocking devices are not used, however, the read method may be modified as follows.

The parasitic currents may be dealt with by using an "equipotential" method disclosed in assignee's U.S. Pat. No. 6,259,644. If configured to use the equipotential method, the read/write circuit 622 may provide the same potential to unselected bit lines 616 as the selected bit line 616, or it may provide the same potential to unselected word lines 614 as the selected bit line 616.

Figure 10:
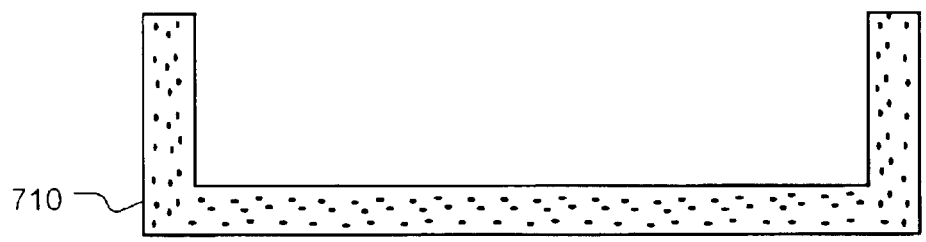
FIGS. 10–14 are illustrations of a method of fabricating the MRAM device.
Figure 11:
Figure 12:
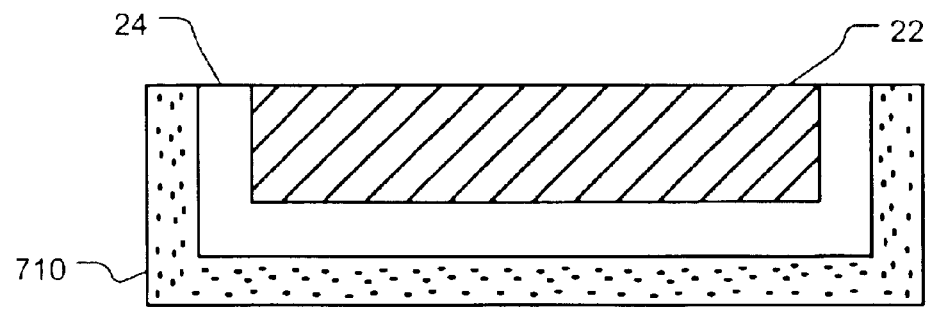

Reference is now made to FIG. 10, which illustrates a method of fabricating the MRAM device 610. A Cu-damascene process may be used to fabricate the clad bit lines 616. The process begins with a planarized dielectric layer 710 in which a trench has been etched prior to interconnect metal deposition (FIG. 10). A thin layer of ferromagnetic material 24 is deposited with an isotropic process so that the side walls are coated to roughly the same thickness as the bottom of the trench (FIG. 11). The ferromagnetic material is permeable enough to act as a magnetic core, and it is continuous all around in cross-sections without any breaks or too many voids. The trench is then filled with copper 22 by electroplating or other suitable means. The structure is then planarized. The planarized structure is shown in FIG. 12.

A stack of magnetic material is deposited. The stack includes material for the data layers 14, material for the insulating tunnel barriers 16, and material for the reference layers 12. The material for the reference layers 14 forms a closed flux path with the ferromagnetic cladding.

Figure 13:
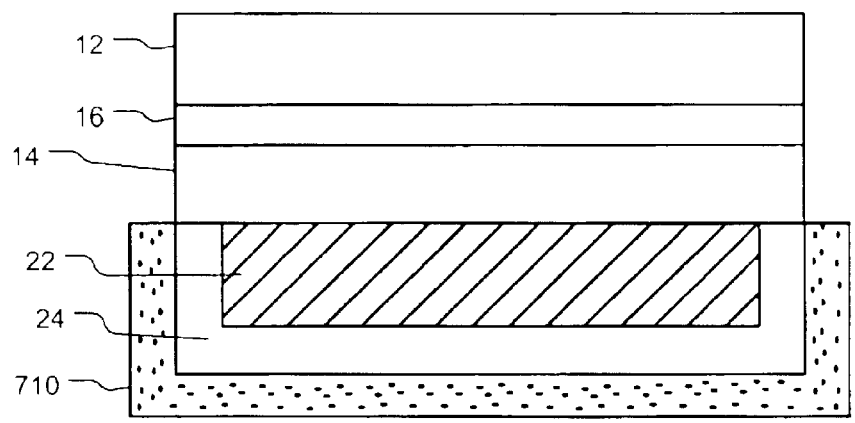
Figure 14:
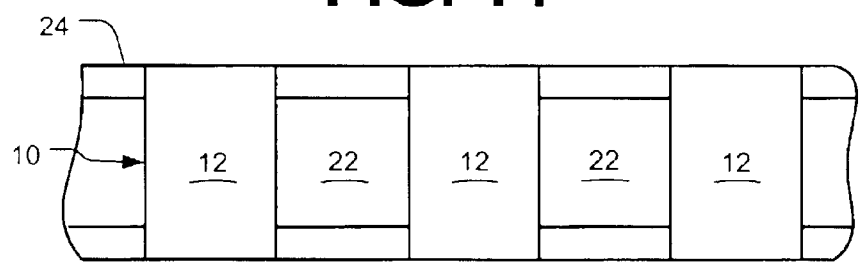

The stack is patterned into bits (FIGS. 13 and 14). Spaces between the bits are filled with dielectric material, and word lines are formed. Each word line is formed over a row of data layers 12.

Figure 17:
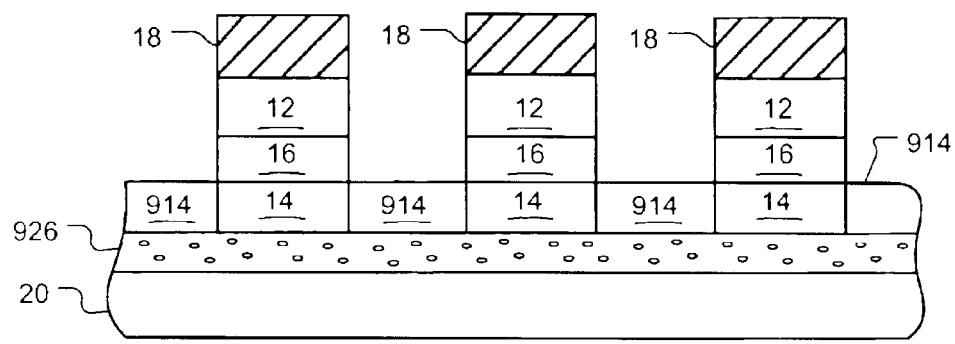
FIGS. 16–17 are illustrations of a magnetic memory device according to a third embodiment of the present invention.
Figure 15:
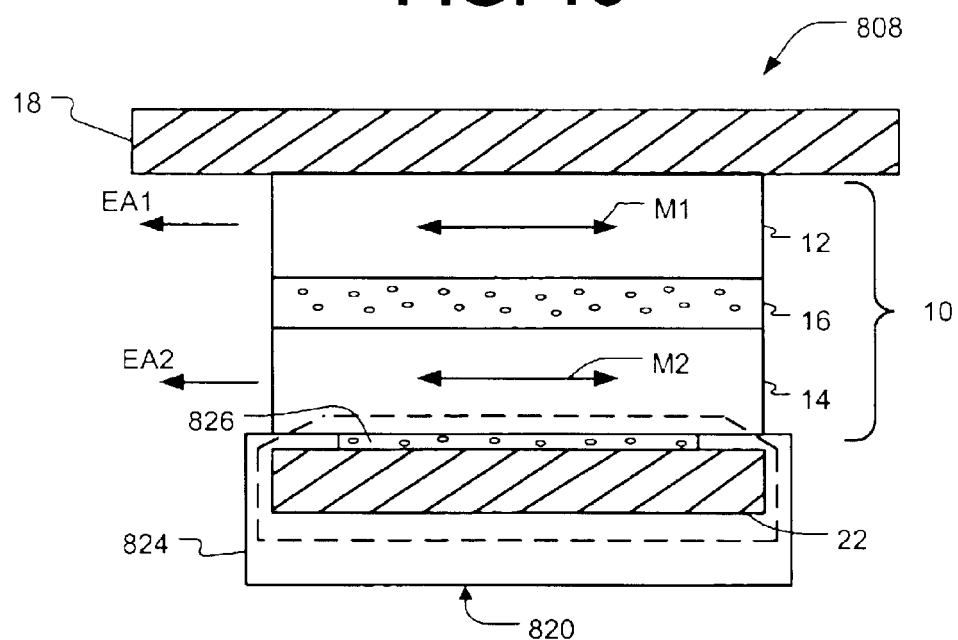
FIG. 15 is an illustration of a magnetic memory device according to a second embodiment of the present invention.
Figure 16:
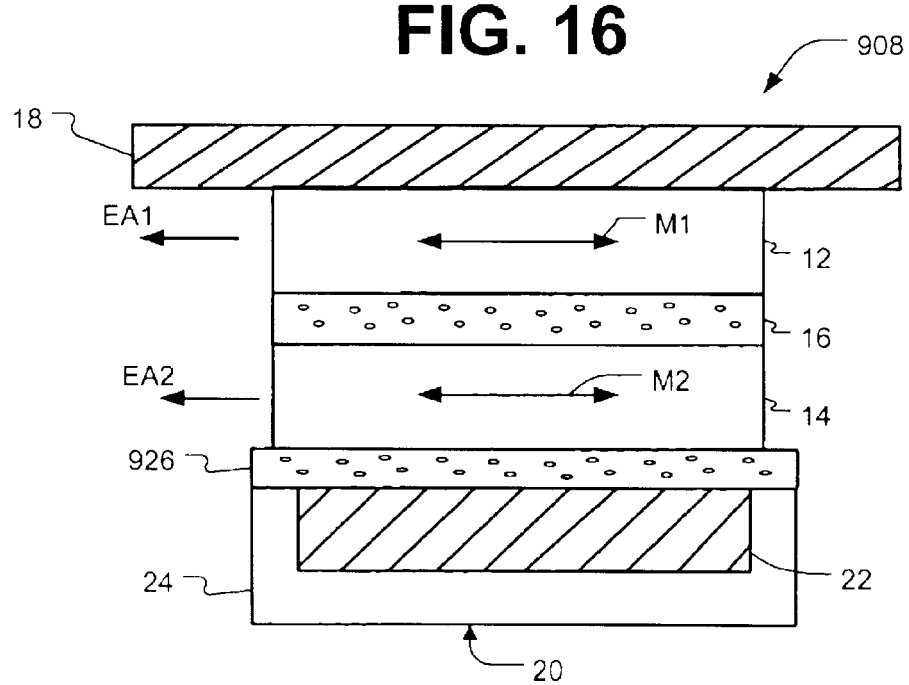

Alternative embodiments of a magnetic memory device according to the present invention are illustrated in FIGS. 15–17. FIG. 15 shows a second embodiment of a magnetic memory device 808, which is the same as the first embodiment, except for the structure 820. In addition to covering three sides of the second conductor 22, the ferromagnetic cladding 824 covers portions of the upper surface of the second conductor 22. On the upper surface, opposing portions of the cladding 824 define a magnetic gap 826. The magnetic gap 826 may be filled with a dielectric material. Those portions are in direct contact with the second conductor 22.

The structure 820 may be provided with a larger cross-section than the magnetic tunnel junction 10 to compensate for manufacturing tolerances. During manufacture, the reference layer 14 should be centered over the ferromagnetic cladding portions defining the magnetic gap 826. In practice, however, misalignments can occur. Even it misalignments occur, the reference layer 14 should still be positioned over the ferromagnetic cladding 824 to close the flux path.

FIGS. 16–17 show a third embodiment of a magnetic memory device 908, which is the same as the first embodiment, except for a dielectric layer 926 between the reference layers 914 and the structure 20, and the addition of non-magnetic segments 914 extending between the reference layers 14. The dielectric layer 826 is thin enough to magnetically couple the reference layers 914 to the ferromagnetic cladding 24 of the structure 20. Yet the dielectric layer 826 is thick enough to electrically insulate the reference layers 914 from the ferromagnetic cladding 24 and the second conductor 22. The segments 914 are electrically conductive. Resulting is a three-conductor design.

Although the present invention was described in connection with a magnetic tunnel junction, it is not so limited. The present invention may be applied to other types of magneto-resistive devices that have similar operational characteristics. For instance, the present invention may be applied to giant magneto-resistive (GMR) devices. A GMR device has the same basic configuration as a TMR device, except that data and reference layers are separated by a conductive non-magnetic metallic layer instead of an insulating tunnel barrier. Exemplary spacer layer metals include gold, silver and copper. The relative orientations of the data and reference magnetization vectors affect in-plane resistance of a GMR device.

The present invention is not limited to GMR and TMR devices. For instance, the present invention may be applied to to top and bottom spin valves.

Although several specific embodiments of the present invention have been described and illustrated, the present invention is not limited to the specific forms or arrangements of parts so described and illustrated. Instead, the present invention is construed according to the claims the follow.

What is claimed is:

1. A magnetic memory device comprising:
   first and second ferromagnetic layers, each ferromagnetic layer having a magnetization that can be oriented in either of two directions, the first ferromagnetic layer having a higher coercivity than the second ferromagnetic layer; and
   a structure for forming a closed flux path with the second ferromagnetic layer.

2. The device of claim 1, wherein the structure includes a conductor clad with ferromagnetic material, portions of the ferromagnetic material in magnetic communication with the second ferromagnetic layer.

3. The device of claim 2, wherein all but a surface of the conductor is clad, wherein the unclad surface is in direct contact with the second ferromagnetic layer.

4. The device of claim 2, wherein portions of the ferromagnetic material define a magnetic gap, the portions in direct contact with the second ferromagnetic layer.

5. The device of claim 1, wherein the first layer is a data layer, and the second layer is a reference layer.

6. The device of claim 5, wherein the data layer and the reference layer are made of at least one of different shapes, thickness and ferromagnetic materials.

7. The device of claim 1, further comprising an insulating tunnel barrier between the ferromagnetic layers.

8. The device of claim 1, further comprising a non-magnetic metallic layer between the ferromagnetic layers.

9. A device comprising:
- a magnetic tunnel junction including first and second ferromagnetic layers; and
- means for forming a closed flux path with one of the ferromagnetic layers.

10. A structure for a magnetic memory device including a ferromagnetic layer, the structure comprising:
- an electrical conductor; and
- ferromagnetic cladding on the conductor, the ferromagnetic cladding forming a closed flux path with the ferromagnetic layer.

11. The structure of claim 10, wherein all but a surface of the conductor is clad, wherein the unclad surface is in direct contact with the ferromagnetic layer.

12. The structure of claim 10, wherein portions of the ferromagnetic cladding define a magnetic gap, the portions in direct contact with the ferromagnetic layer.

13. The structure of claim 10, wherein the ferromagnetic layer is a reference layer, whereby the cladding forms a closed flux path with the reference layer of the magnetic memory device.

* * * * *